(12) United States Patent
Bell et al.

(10) Patent No.: US 11,829,366 B2
(45) Date of Patent: Nov. 28, 2023

(54) APPARATUSES AND METHODS FOR ON-MEMORY PATTERN MATCHING

(71) Applicant: MICRON TECHNOLOGY, INC., Boise, ID (US)

(72) Inventors: Debra M. Bell, Boise, ID (US); Libo Wang, Boise, ID (US); Di Wu, Boise, ID (US); James S. Rehmeyer, Boise, ID (US); Anthony D. Veches, Boise, ID (US)

(73) Assignee: MICRON TECHNOLOGY, INC., Boise, ID (US)

( * ) Notice: Subject to any disclaimer, the term of this patent is extended or adjusted under 35 U.S.C. 154(b) by 0 days.

(21) Appl. No.: 17/819,793

(22) Filed: Aug. 15, 2022

(65) Prior Publication Data

US 2022/0391396 A1 Dec. 8, 2022

Related U.S. Application Data

(63) Continuation of application No. 16/807,692, filed on Mar. 3, 2020, now Pat. No. 11,442,940.

(51) Int. Cl.
| | |
|---|---|
| *G06F 16/2455* | (2019.01) |
| *G11C 11/407* | (2006.01) |
| *G11C 11/4096* | (2006.01) |
| *G11C 11/54* | (2006.01) |
| *G11C 7/10* | (2006.01) |

(52) U.S. Cl.
CPC ...... *G06F 16/24558* (2019.01); *G11C 11/407* (2013.01); *G11C 7/1006* (2013.01); *G11C 7/1063* (2013.01); *G11C 11/4096* (2013.01); *G11C 11/54* (2013.01)

(58) Field of Classification Search
CPC ... G11C 11/407; G11C 7/1006; G11C 7/1063; G11C 11/4096; G11C 11/54; G06F 16/24558
USPC ........................................................ 711/127
See application file for complete search history.

(56) References Cited

U.S. PATENT DOCUMENTS

| | | | |
|---|---|---|---|
| 5,638,317 | A | 6/1997 | Tran |
| 11,442,940 | B2 | 9/2022 | Bell et al. |
| 2007/0047346 | A1 | 3/2007 | Sumino |
| 2008/0025073 | A1 | 1/2008 | Arsovski |

(Continued)

FOREIGN PATENT DOCUMENTS

| | | |
|---|---|---|
| CN | 103592593 A | 2/2014 |
| JP | H064582 A | 1/1994 |

(Continued)

OTHER PUBLICATIONS

ISR and WO dated Jun. 15, 2021 for PCT Application No. PCT/US2021/019435; pp. all.

*Primary Examiner* — Ly D Pham
(74) *Attorney, Agent, or Firm* — Dorsey & Whitney LLP

(57) ABSTRACT

Embodiments of the disclosure are drawn to apparatuses, systems, methods, and memories that are capable of performing pattern matching operations within a memory device. The pattern matching operations may be performed on data stored within the memory based on a pattern stored in a register. The result of the pattern matching operation may be provided by the memory. The data on which the pattern matching operation is performed may not be output from the memory during the pattern matching operation.

20 Claims, 5 Drawing Sheets

(56) References Cited

U.S. PATENT DOCUMENTS

| | | | |
|---|---|---|---|
| 2009/0157721 A1* | 6/2009 | Tal | G06F 8/443 |
| | | | 707/999.102 |
| 2010/0195384 A1 | 8/2010 | Sharon et al. | |
| 2012/0188820 A1* | 7/2012 | Neumeyer | G11C 7/14 |
| | | | 365/185.2 |
| 2015/0279466 A1 | 10/2015 | Manning | |
| 2018/0033489 A1 | 2/2018 | Son et al. | |
| 2021/0279242 A1 | 9/2021 | Bell et al. | |

FOREIGN PATENT DOCUMENTS

| | | |
|---|---|---|
| JP | 2009099202 A | 5/2009 |
| WO | 2021178179 A1 | 9/2021 |

* cited by examiner

APPARATUSES AND METHODS FOR ON-MEMORY PATTERN MATCHING

CROSS REFERENCE TO RELATED APPLICATION(S)

This application is a continuation of U.S. patent application Ser. No. 16/807,692 filed Mar. 3, 2020 and issued as U.S. Pat. No. 11,442,940 on Sep. 13, 2022. The aforementioned application, and issued patent, is incorporated herein by reference, in its entirety, and for any purpose.

BACKGROUND

This disclosure relates generally to memory devices, including volatile memory, such as dynamic random access memory (DRAM). Data may be stored in individual memory cells of the DRAM. The memory cells may be organized in an array of rows and columns. Each memory cell in a row may be coupled to a word line and each memory cell in a column may be coupled to a bit line. Thus, every memory cell is coupled to a word line and a bit line. Data may be provided to and retrieved from the DRAM for performing various computations by a microprocessor, graphical processing unit, or other circuitry.

A growing number of computational applications such as artificial intelligence and big data analysis require pattern matching operations. Data to be searched for patterns is provided from a data storage device (e.g., hard drive) to the DRAM and then to a processor where pattern matching operations are performed.

DETAILED DESCRIPTION

Figure 1:
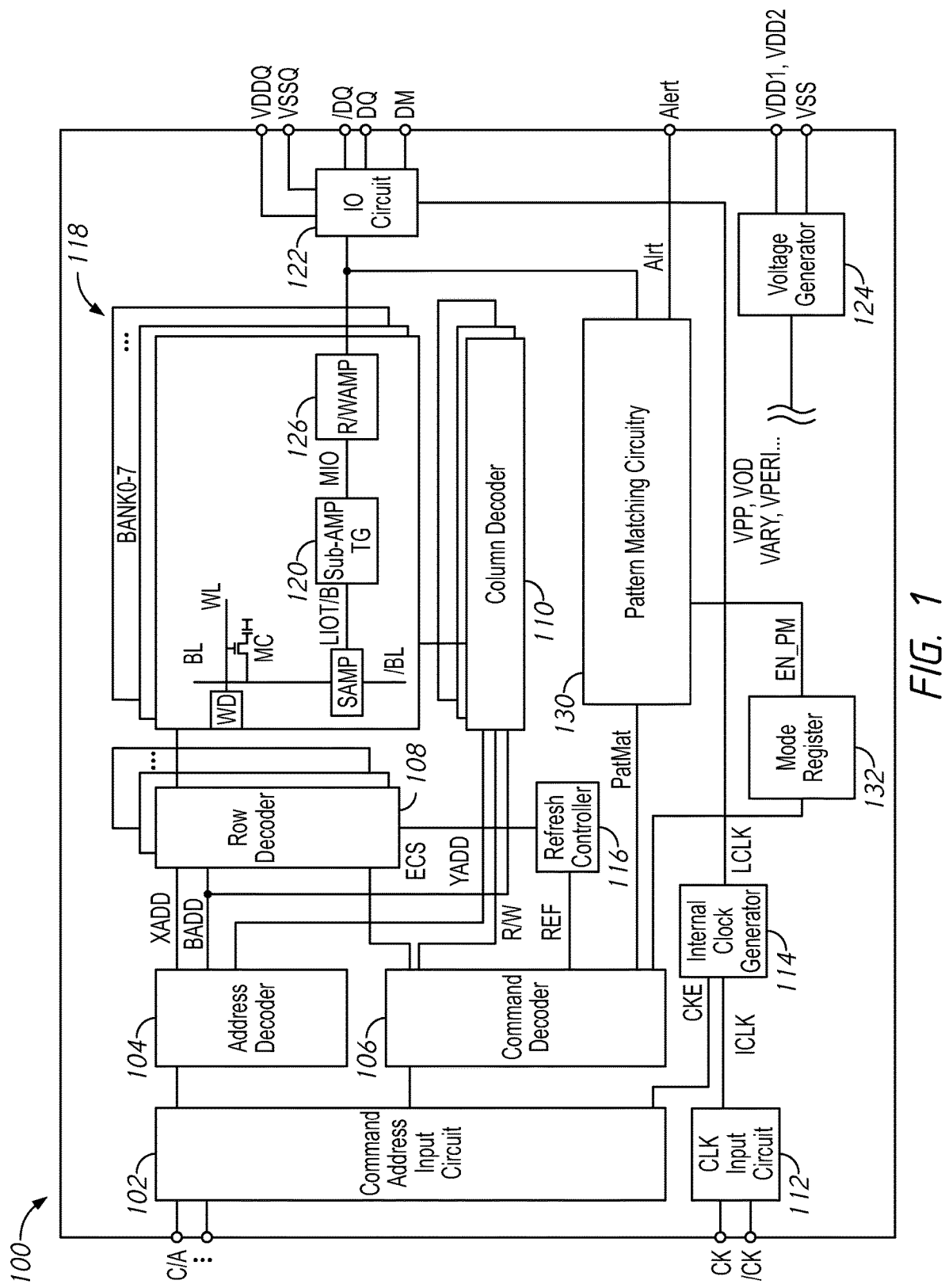
FIG. 1 is a block diagram of a semiconductor device according to embodiments of the present disclosure.

The following description of certain embodiments is merely exemplary in nature and is in no way intended to limit the scope of the disclosure or its applications or uses. In the following detailed description of embodiments of the present systems and methods, reference is made to the accompanying drawings which form a part hereof, and which are shown by way of illustration specific embodiments in which the described systems and methods may be practiced. These embodiments are described in sufficient detail to enable those skilled in the art to practice presently disclosed systems and methods, and it is to be understood that other embodiments may be utilized and that structural and logical changes may be made without departing from the spirit and scope of the disclosure. Moreover, for the purpose of clarity, detailed descriptions of certain features will not be discussed when they would be apparent to those with skill in the art so as not to obscure the description of embodiments of the disclosure. The following detailed description is therefore not to be taken in a limiting sense, and the scope of the disclosure is defined only by the appended claims.

Dynamic random access memory (DRAM) is often used to store data for performing or generated from computations performed by a microprocessor, graphical processing unit, application specific integrated circuit, and/or other circuitry (collectively referred to herein as processing circuitry). Data may be transferred to and from the DRAM from the processing circuitry and/or a long term data storage device (e.g., non-volatile memory). For example, data may be retrieved from a hard drive and provided to the DRAM. The data may then be provided to the processing circuitry from the DRAM as needed for computations performed by the processing circuitry. In some devices, providing data to and from the DRAM may be controlled by a memory controller. The memory controller may be integrated into the processing circuitry and/or a separate component in communication with the DRAM and the processing circuitry.

A growing number of computational applications such as artificial intelligence and big data analysis require pattern matching operations. For example, massive databases of genomic information may be searched for particular sequences. In another example, a neural network may be trained to search for certain features in image data to identify an object in the image. Currently, data to be searched for patterns is provided from the long term data storage device to the DRAM to the processing circuitry where pattern matching operations are performed. However, transferring the data between components may slow down the pattern matching computations in some applications. Accordingly, it would be desirable to reduce the data transferred between the components.

According to embodiments of the present disclosure, a memory, such as DRAM, may include circuitry for performing pattern matching computations, referred to herein as pattern matching circuitry. In some embodiments, the pattern matching circuitry may include a comparator circuit and one or more registers in communication with the comparator circuit. The memory may receive a pattern and data to be analyzed to determine whether or not the pattern is present in the data (e.g., the data includes one or more pattern matches). The pattern matching may be performed by (e.g., on board) the memory and the data to be analyzed need not be provided outside the memory to other processing circuitry for pattern matching operations. Rather, in some embodiments, only the results of the pattern matching operations may be provided by the memory. In some applications, performing the pattern matching operations by memory and only providing the results may reduce the time required for pattern matching operations at least because less data is transferred between the memory and the processing circuitry.

FIG. 1 is a block diagram showing an overall configuration of a semiconductor device 100 according to at least one embodiment of the disclosure. The semiconductor device 100 may be a semiconductor memory device, such as a DRAM device integrated on a single semiconductor chip in some examples.

The semiconductor device 100 includes a memory array 118. The memory array 118 is shown as including a plurality of memory banks. In the embodiment of FIG. 1, the memory array 118 is shown as including eight memory banks BANK0-BANK7. More or fewer banks may be included in the memory array 118 in other embodiments. Each memory bank includes a plurality of word lines WL, a plurality of bit lines BL and /BL, and a plurality of memory cells MC arranged at intersections of the plurality of word lines WL and the plurality of bit lines BL and /BL. The selection of the word line WL is performed by a row decoder 108 and the selection of the bit lines BL and /BL is performed by a column decoder 110. A selected word line WL may be driven to a desired charge by word line driver WD. In the embodiment of FIG. 1, the row decoder 108 includes a respective row decoder for each memory bank and the column decoder 110 includes a respective column decoder for each memory bank. The bit lines BL and /BL are coupled to a respective sense amplifier (SAMP).

Read data from the bit line BL or /BL is amplified by the sense amplifier SAMP, and provided to sub-amplifier transfer gate 120 over complementary local data lines (LIOT/B). The sub-amplifier transfer gate 120 may act as a switch to form a conductive path between the appropriate LIOT/B and appropriate shared main data lines (MIO). Read data may pass from the local data lines LIOT/B to the main data lines MIO via a conductive path provided by the sub-amplifier transfer gate 120 to a read amplifier 126, which provides the data to an IO circuit 122. Write data received from IO circuit 122 is output from a write amplifier 126 and provided to the sense amplifier SAMP over the complementary main data lines MIO, the sub-amp transfer gate 120, and the complementary local data lines LIOT/B, and written in the memory cell MC coupled to the bit line BL or /BL.

The semiconductor device 100 may employ a plurality of external terminals for transmitting and receiving information from devices external to semiconductor device 100 (e.g., outside the memory), such as a memory controller (not shown in FIG. 1). The external terminals may include command and address (C/A) terminals coupled to a command and address bus to receive commands and addresses, and a CS signal, clock terminals to receive clocks CK and /CK, data terminals DQ to provide data, an alert pin ALERT for providing an Alrt signal, and power supply terminals to receive power supply potentials VDD1, VDD2, VSS, VDDQ, and VSSQ.

The clock terminals are supplied with external clocks CK and /CK that are provided to an input circuit 112. The external clocks may be complementary. The input circuit 112 generates an internal clock ICLK based on the CK and /CK clocks. The ICLK clock is provided to the command decoder 110 and to an internal clock generator 114. The internal clock generator 114 provides various internal clocks LCLK based on the ICLK clock. The LCLK clocks may be used for timing operation of various internal circuits. The internal data clocks LCLK are provided to the input/output circuit 122 to time operation of circuits included in the input/output circuit 122, for example, to data receivers to time the receipt of write data.

The C/A terminals may be supplied with memory addresses. The memory addresses supplied to the C/A terminals are provided, via a command/address input circuit 102, to an address decoder 104. The address decoder 104 receives the address and supplies a decoded row address XADD to the row decoder 108 and supplies a decoded column address YADD to the column decoder 110. The address decoder 104 may also supply a decoded bank address BADD, which may indicate the bank of the memory array 118 containing the decoded row address XADD and column address YADD. The C/A terminals may be supplied with commands. Examples of commands include access commands for accessing the memory, such as read commands for performing read operations and write commands for performing write operations, as well as other commands and operations. The access commands may be associated with one or more row address XADD, column address YADD, and bank address BADD to indicate the memory cell(s) to be accessed.

The commands may be provided as internal command signals to a command decoder 106 via the command/address input circuit 102. The command decoder 106 includes circuits to decode the internal command signals to generate various internal signals and commands for performing operations. For example, the command decoder 106 may provide a row command signal to select a word line WL and a column command signal to select a bit line BL. In another example, the command decoder 106 may provide a mode register command provided to a mode register 132 to select a memory operating condition, such as a memory condition that enables pattern matching operations according to embodiments of the present disclosure.

The device 100 may receive an access command which is a read command. When an activation command is received, and row and bank addresses are timely suppled with the activation command, followed by a read command and a column address is timely supplied with the read command, read data is read from memory cells MC in the memory array 118 corresponding to the row address and column address. The read command is received by the command decoder 106 (e.g., command controller), which provides internal commands so that read data from the memory array 118 is provided to the read amplifier 128. The read data is output to outside from the data terminals DQ via the input/output circuit 122.

The device 100 may receive an access command which is a write command. When an activation command is received, and row and bank addresses are timely suppled with the activation command, followed by a write command and a column address is timely supplied with the write command, write data supplied to the data terminals DQ is written to a memory cells in the memory array 118 corresponding to the row address and column address. The write command is received by the command decoder 106, which provides internal commands so that the write data is received by data receivers in the input/output circuit 122. Write clocks may also be provided to the external clock terminals for timing the receipt of the write data by the data receivers of the input/output circuit 122. The write data is supplied via the input/output circuit 122 to the write amplifier 126, and by the write amplifier 126 to the memory array 118 to be written into the memory cell MC.

The device 100 may also receive commands causing it to carry out a refresh operation. The refresh signal may be a pulse signal which is activated when the command decoder 106 receives a signal which indicates an auto-refresh and/or other refresh command. In some embodiments, the refresh command may be externally issued to the memory device 100. In some embodiments, the refresh command may be periodically generated by a component of the device 100. The refresh signal is provided to the refresh controller 116. A refresh command provided to the refresh controller 116 may cause the device 100 to carry out refresh operations for one or more of the memory banks.

A mode register 132 may be used to define various modes for the device 100. The mode register 132 may retain the stored information until it is reprogrammed, reset, or the device 100 loses power. The mode register 132 may be written via a mode register write command. The mode register 132 may include one or more registers for storing information related to different memory operations or configurations. For example, the mode register 132 may be used to set burst length, burst type, latency, frequency set point, enable programmable termination components, enable certain memory operations, as well as others. The mode register 132 may also be programmed with information that can be read to provide status information about the device 100. For example, the mode register 132 may be used to provide a ready status, calibration status, as well as other status information. The information that is read may be programmed by circuits of the device 100. The mode register 132 may be read via a mode register read command. Reading the mode register 132 allows information about the status of operations and configurations to be provided by the device 100.

According to embodiments of the present disclosure, the mode register 132 may be used to specify a mode of operation in which pattern matching operations are performed by pattern matching circuitry 130. For example, when a particular value is written to the mode register 132, pattern matching operations may be implemented by the pattern matching circuitry 130 using signals provided to the memory, and when a different particular value is written to the mode register 132, the pattern matching operations may not occur (e.g., the pattern matching circuitry 130 may be disabled). A pattern matching operation may be performed by the pattern matching circuitry 130, for example, with a comparator circuit, in response to a one or more pattern matching commands in some embodiments. When the mode register 132 is programmed to enable pattern matching operations, the mode register 132 may provide a control signal EN_PM that enables pattern matching circuitry 130, which may include one or more registers and one or more comparator circuits (not shown in FIG. 1). When the pattern matching circuitry 130 is enabled by the control signal EN_PM from the mode register 132, the pattern matching circuitry 130 may respond to one or more pattern matching commands PatMat provided by the command decoder 106. If disabled, the pattern matching commands PatMat may be ignored. Responsive to the one or more pattern matching commands, the pattern matching circuitry 130 may store a pattern in a register, perform a pattern matching operation on data stored in the memory array 118 to determine if the pattern is present in the data stored in the memory array 118, write a result of the pattern matching operation to a register, alter data in the array 118 based on the result of the pattern matching operation, provide the result from the register to the IO circuit 122, and/or provide an alert signal Alrt to an alert pin.

The pattern matching circuitry 130 may form an integral part of the device 100. For example, the pattern matching circuitry 130 may be formed in a same semiconductor die as the memory array 118. In some examples, the pattern matching circuitry 130 may be on a same printed circuit board as the memory array 118. In this manner, the pattern matching circuitry may be closer to a memory array than a processor or host device may be. For example, a latency or access time between the pattern matching circuitry 130 and the memory array 118 may be expected to be less than a latency or access time for passing data from the memory array 118 to output pins or ports of the device 100, such as if the data were provided to a processor or host.

In some embodiments, mode register commands, pattern matching commands, and/or other commands provided by the command decoder 106 may be responsive to commands received from a memory controller (not shown in FIG. 1, see FIG. 3) external to the device 100.

Power supply terminals of device 100 are supplied with power supply potentials VDD1, VDD2, and VSS. The power supply potentials VDD1, VDD2, and VSS are supplied to an internal voltage generator circuit 124. The internal voltage generator circuit 124 generates various internal potentials VPP, VOD, VARY, VPERI, and the like based on the power supply potentials VDD1, VDD2, and VSS supplied to the power supply terminals. While the various internal potentials and power supply potentials may be used for any of the different circuits of the device 100, the internal potential VPP is mainly used in the row decoder 108, the internal potentials VOD and VARY are mainly used in the sense amplifiers SAMP included in the memory array 118, and the internal potential VPERI is used in many peripheral circuit blocks.

The power supply terminals are also supplied with power supply potentials VDDQ and VSSQ. The power supply potentials VDDQ and VSSQ are supplied to the input/output circuit 122. The power supply potentials VDDQ and VSSQ supplied to the power supply terminals may be the same potentials as the power supply potentials VDD and VSS supplied to the power supply terminals in an embodiment of the disclosure. The power supply potentials VDDQ and VSSQ supplied to the power supply terminals may be different potentials from the power supply potentials VDD and VSS supplied to the power supply terminals in another embodiment of the disclosure. The power supply potentials VDDQ and VSSQ supplied to the power supply terminals are used for the input/output circuit 122 so that power supply noise generated by the input/output circuit 122 does not propagate to the other circuit blocks.

The components of semiconductor device 100 (e.g., command decoder 106, mode register 132, pattern matching circuitry 130) may transmit and/or receive information with other components of semiconductor device 100 without accessing the external terminals (e.g., C/A, DQ). In some embodiments, the components may be coupled to one another by conductive traces for transmitting and/or receiving information (e.g., the PatMat line, EN_PM line, XADD line). Components that can communicate with other components of semiconductor device 100 without accessing the external terminals may be considered on semiconductor device 100 (e.g., "on memory" or "of the memory" when semiconductor device 100 is a memory device) and other components or devices that must access the external terminals of semiconductor device 100 to communicate with components of semiconductor device 100 may be considered off and/or outside semiconductor device 100 (e.g., "off memory" when semiconductor device 100 is a memory device).

Figure 2:
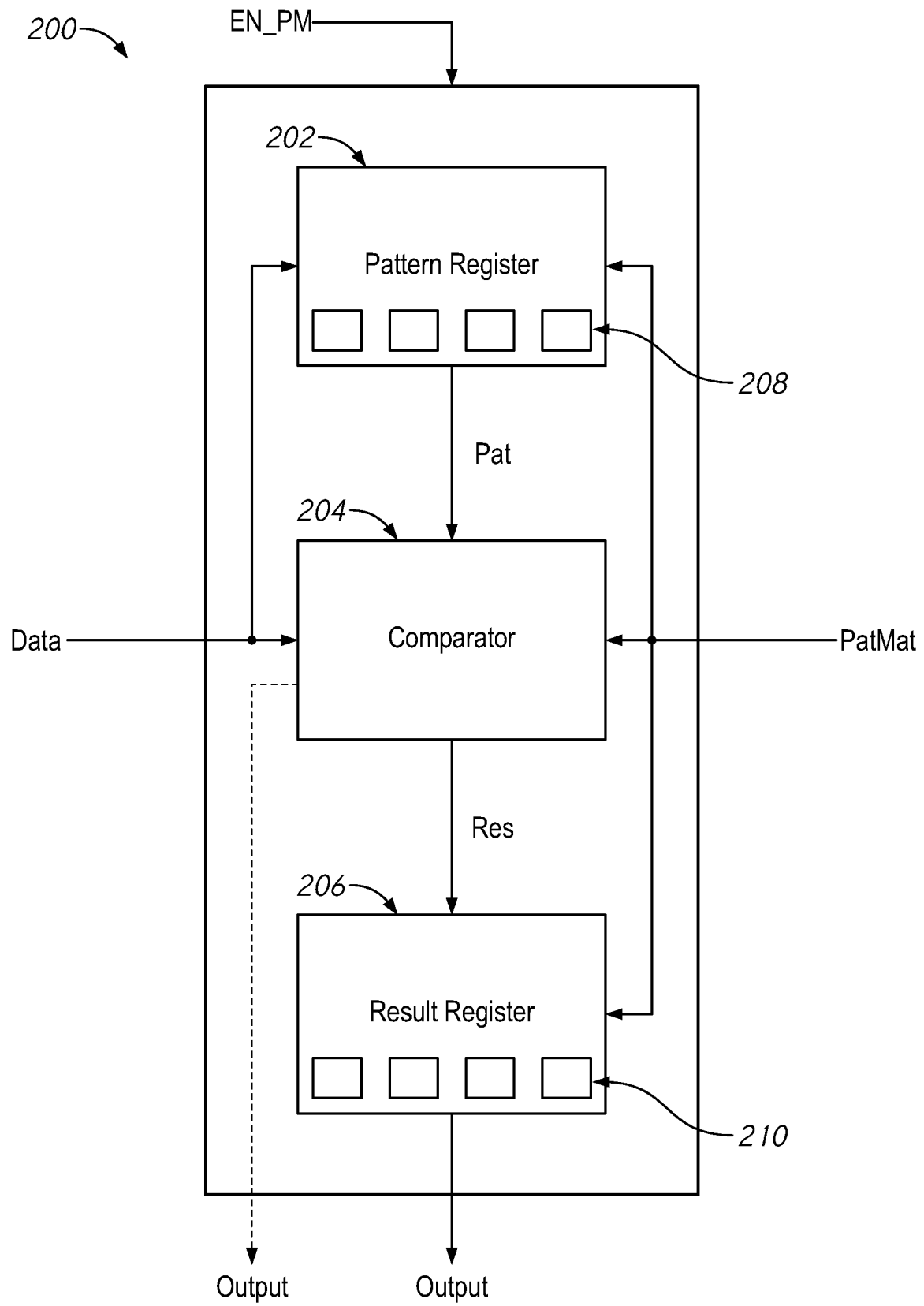
FIG. 2 is a block diagram of pattern matching circuitry according to embodiments of the present disclosure.

FIG. 2 is a block diagram of pattern matching circuitry 200 according to embodiments of the present disclosure. In some embodiments, pattern matching circuitry 200 may be included in pattern matching circuitry 130 shown in FIG. 1. The pattern matching circuitry 200 may include a pattern register 202, a comparator 204, and a result register 206. In some embodiments, the pattern matching circuitry 200 may be included on a semiconductor die including a memory array. In some embodiments, some or all of the components of the pattern matching circuitry 200, such as the comparator 204, may be included under the memory array.

The pattern matching circuitry 200 may be enabled by a control signal EN_PM. In some embodiments, the control signal may be provided by a mode register, such as mode register 132. The pattern matching circuitry 200 may receive one or more pattern matching commands PatMat. In some embodiments, the pattern matching commands PatMat may be provided by a command decoder, such as command decoder 106. The pattern matching circuitry 200 may receive data, which may be provided to the pattern register 202 and/or comparator 204. The data may be provided from a memory array, such as memory array 118 and/or an IO circuit such as IO circuit 122.

The pattern register 202 may store one or more patterns to be used in a pattern matching operation. In some embodiments, a pattern may include one or more bits (e.g., a string of bits). In some embodiments, the pattern register 202 may include multiple registers 208. Each register 208 may store one or more patterns. In some embodiments, the pattern register 202 may be implemented using a multipurpose register (MPR). In these embodiments, a pattern may be written to the pattern register 202 using an MPR write command. In other embodiments, a pattern may be written to the pattern register 202 responsive to a pattern register write command.

The comparator 204 may receive the pattern Pat from the pattern register 202 and data (which may be from a memory array in some embodiments). The comparator 204 may perform a pattern matching operation to determine if the data includes Pat. In some embodiments, the comparator 204 may perform pattern matching operations for multiple patterns Pat, for example, when pattern register 202 includes more than one pattern. The pattern matching operations on multiple patterns may be performed sequentially or in parallel. In some embodiments, the comparator 204 may be hard coded to perform a single type of pattern matching operation. In other embodiments, the comparator 204 may be programmed (e.g., via a pattern matching command PatMat) to perform a particular type of pattern matching operation. The type of pattern matching operation may determine a type of comparison performed (e.g., find exact matches of Pat, find matches within a certain percentage of Pat, if Pat is a vector, find vectors in the data within a certain distance of the vector). Based on the determination of the pattern matching operation, the comparator may generate a result Res. In some embodiments, Res may include a count value of a number of times Pat is present in the data, a memory address of a location of a match of Pat in the data, a flag, and/or a combination thereof. The result Res may also be referred to as a pattern indication.

In some embodiments, the type of pattern matching operation may define the type of result generated as Res and/or other actions to be taken by the pattern matching circuitry 200 based on the result of the pattern matching operation. For example, in some embodiments, the pattern matching circuitry 200 may delete contents of the memory array where the data matches Pat or writing a pre-determined value to the memory array where the data matches Pat.

In some embodiments, the comparator 204 may include comparator logic such as a plurality of XOR logic circuits. The number of logic circuits may be based, at least in part, on a length (e.g., number of bits) in the pattern to be matched. In some embodiments, the comparator 204 may include one or more content addressable memory (CAM) cells. Other logic circuits or other circuit components (e.g., operational amplifiers) may be included in the comparator 204 in some embodiments.

The result register 206 may store one or more results Res (or indications of the results) output by the comparator 204 responsive to the pattern matching operation. In some embodiments, the result register 206 may include multiple registers 210. Each register 210 may store one or more results. In some embodiments, the result register 206 may include a multipurpose register (MPR). In these embodiments, a result register 206 may be read using an MPR read command. In other embodiments, a result may be read from the result register 206 responsive to a result register read command. In some embodiments, the result may be provided as Output. In some embodiments, the result register 206 may provide the Output to an IO circuit, such as IO circuit 122. In some embodiments, the result register 206 may provide the Output to the memory array. In some embodiments, the result register 206 may generate a signal, such as an alert signal as the Output. The alert signal may be provided to an alert pin (see FIG. 1) in some embodiments.

Optionally, in some embodiments, the comparator 204 may provide the Output in addition to or instead of the result register 206. In these embodiments, the result register 206 may be omitted.

Figure 3:
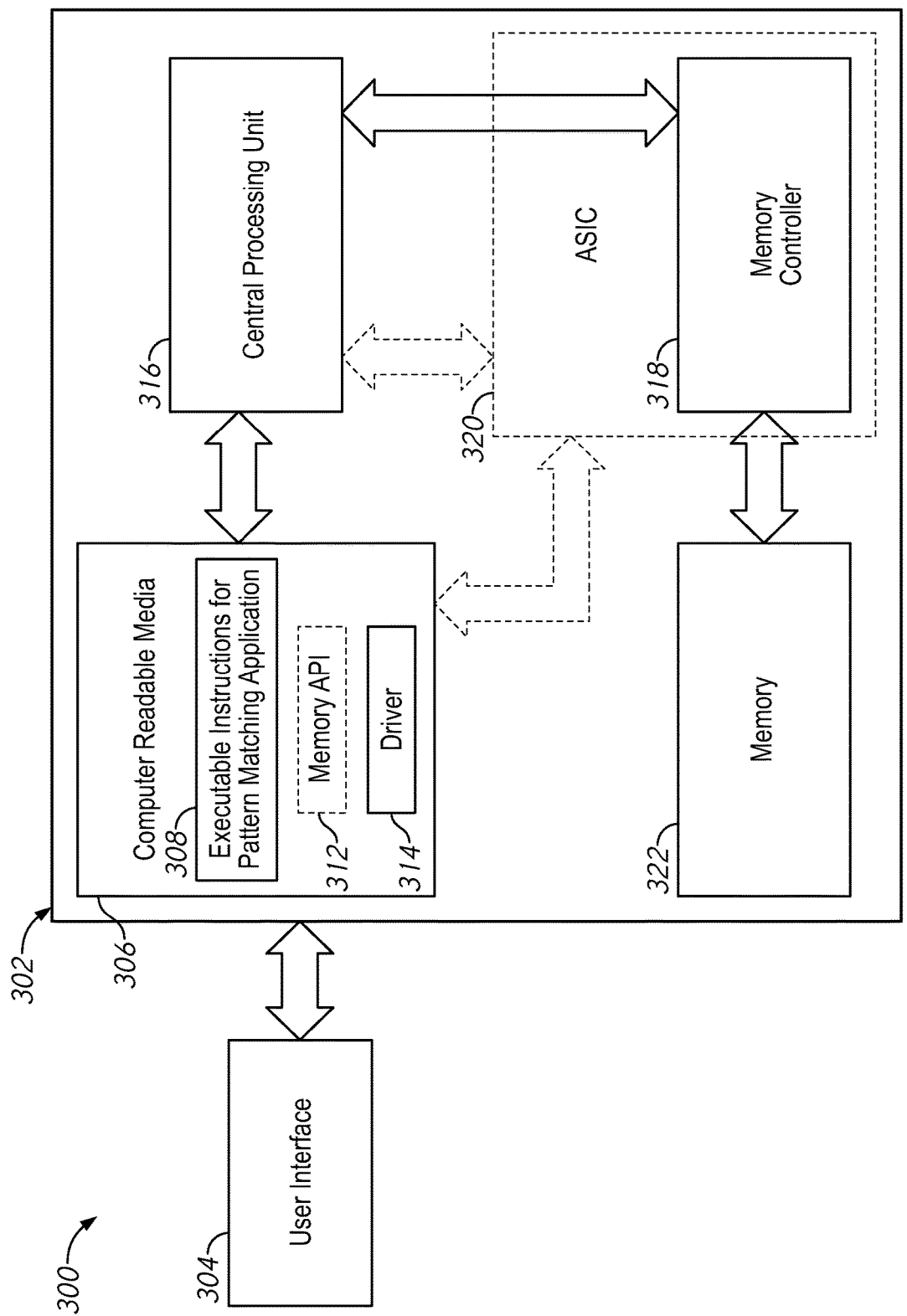
FIG. 3 is a block diagram of a system according to embodiments of the present disclosure.

FIG. 3 is a block diagram of a system 300 according to embodiments of the present disclosure. The system 300 may include a computing device 302 and a user interface 304. The computing device 302 may include computer readable media 306, a central processing unit (CPU) 316, a memory controller 318, and a memory 322. In some embodiments, the computing device 302 may further include an application specific integrated circuit (ASIC) 320. In some embodiments, the computing device 302 may include the ASIC 320 instead of the CPU 316. While a CPU is illustrated in FIG. 3, generally any number or kind of processor(s) may be used. In some embodiments, when the computing device 302 includes the ASIC 320, the memory controller 318 may be integrated with the ASIC 320. In other embodiments, the memory controller 318 may be separate from the ASIC 320. In some embodiments, the memory 322 may include at least a portion of device 100 and/or pattern matching circuitry 200.

The user interface 304 may provide outputs of the computing device 302 to a user and provide inputs from the user to the computing device 302. In some embodiments, the user interface 304 may include a display (e.g., LCD, CRT) and/or speakers for providing outputs. In some embodiments, the user interface 304 may include user controls for providing inputs such as a keyboard, touch screen, keyboard, mouse, and/or track pad.

The computer readable media 306 may be implemented using any media, including non-transitory computer readable media. Examples include memory, read only memory (RAM), read only memory (ROM), volatile or non-volatile memory, hard drive, solid state drives, or other storage. While a single computer readable media 306 is shown in FIG. 3, multiple media may be present and the executable instructions described herein may be provided on one or more computer readable media. The computer readable media may be used to implement software and/or firmware components. The computer readable media 306 may be encoded with executable instructions for a pattern matching application 308. The executable instructions may be executed, for example by the CPU 316. The pattern matching application 308 may include instructions for implementing a neural network, a training program for a neural network, a big data analysis application, and/or other application. In some embodiments, the computer readable media 306 may be encoded with executable instructions for a memory application programming interface (API) 312. The memory API 312 may allow a user (e.g., another process) access and control over on-board pattern matching capabilities of the memory 322. For example, the memory API 312 may allow a user to decide whether or not the pattern matching application 308 will utilize the on-board pattern matching capabilities of the memory 322 or perform pattern matching operations on the CPU 316. In another example, the memory API 312 may allow a user to determine a type of pattern matching operation to be performed by the memory 322. In some embodiments, the memory API 312 may be included within the pattern matching application 308. In some embodiments, the pattern matching application 308 automatically determines whether and how to utilize the on-board pattern matching capabilities of the memory 322 and the memory API 312 may be omitted. In some embodiments, the computer readable media 306 may be encoded with instructions for implementing a driver 314. The driver 314 may provide instructions for an operating system of the computing device 302 for interacting with one or more components of the computing device 302 (e.g., CPU 316, memory controller 318, ASIC 320, and/or memory 322).

The CPU 316 may execute instructions encoded on the computer readable media 306. For example, instructions used to implement the pattern matching application 308. In some embodiments, the CPU 316 may include or may be replaced by one or more graphical processing units. The CPU 316 may provide and receive data from the memory 322 via the memory controller 318. The memory controller 318 may control how data is input and output from the memory 322. The memory controller 318 may issue commands to the memory 322, such as mode register write commands, read commands, write commands, and/or pattern matching operation commands.

In some embodiments, computing device 302 may include an ASIC 320 in addition to or instead of CPU 316. When the computing device 302 includes both the ASIC 320 and the CPU 316, the ASIC 320 may receive and provide signals to the CPU 316 and/or computer readable media 306. When the computing device 302 does not include the CPU 316, the ASIC 320 may perform computations responsive to instructions provided by the non-transitory computer readable media 306. While in some embodiments, the ASIC 320 may have fewer computing capabilities than the CPU 316, the ASIC 320 may be smaller and/or require less power than the CPU 316. In some applications, such as mobile devices, the size and power advantages of the ASIC 320 may outweigh the computing advantages of the CPU 316. While an ASIC 320 is shown in FIG. 3, other processing circuitry may be used in other examples (e.g., one or more controllers, microcontrollers, field programmable gate array (FPGA) circuits).

Figure 4:
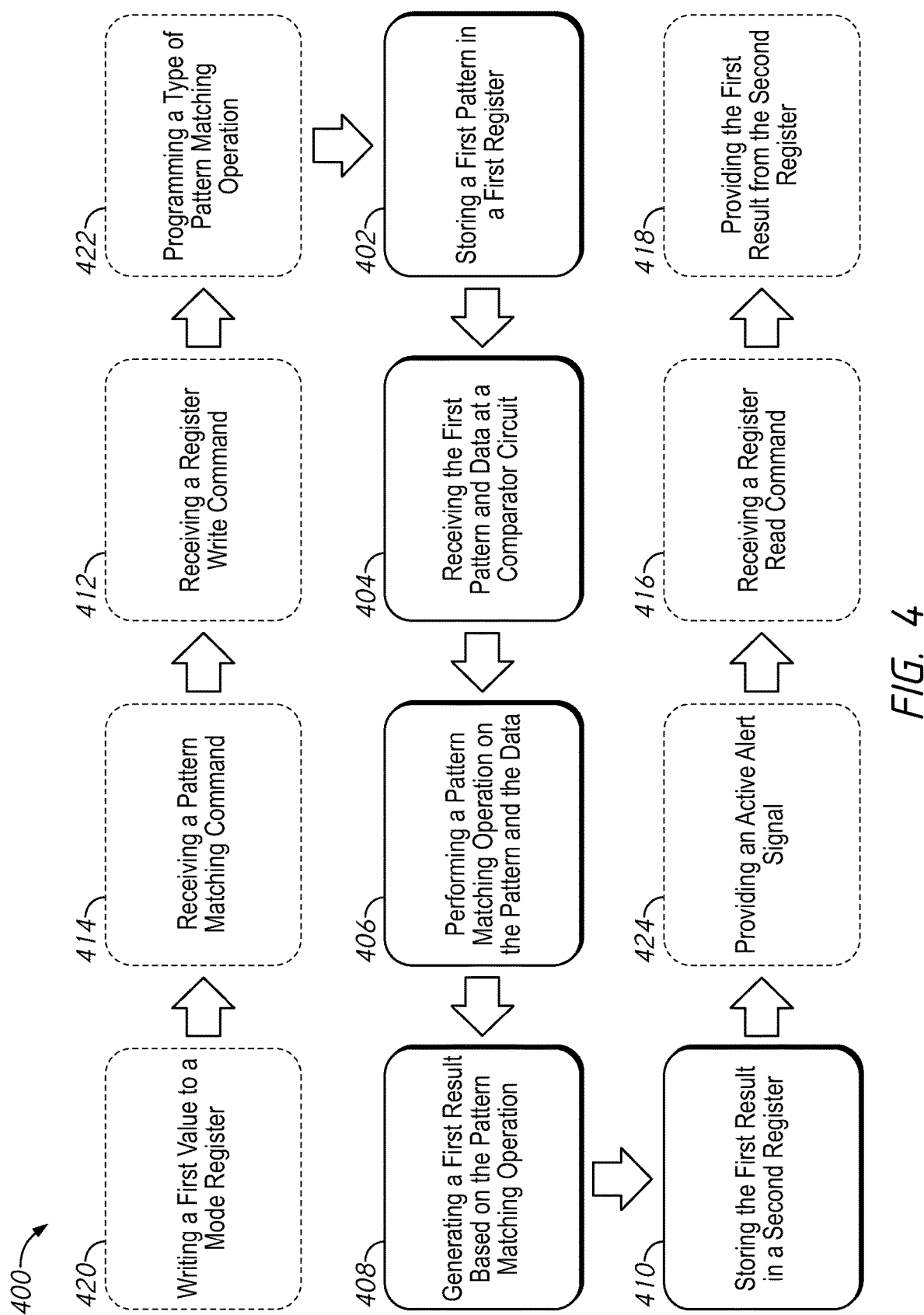
FIG. 4 is a flow chart of a method according to embodiments of the present disclosure.

FIG. 4 is a flow chart of a method 400 according to embodiments of the present disclosure. In some embodiments, the method 400 may be performed, at least in part, by device 100, pattern matching circuitry 200 and/or system 300.

At block 402, "storing a first pattern in a first register" may be performed. In some embodiments, the pattern may be stored in pattern register 202. At block 404, "receiving the first pattern and data at a comparator circuit" may be performed. In some embodiments, the comparator 204 may receive the first pattern and the data. In some embodiments, the data is received from a memory array, such as memory array 118. At block 406, "performing a pattern matching operation on the pattern and the data" may be performed. In some embodiments, the pattern matching operation may be performed by the comparator. The pattern matching operation may determine if the first pattern is present in the data. At block 408, "generating a first result based on the pattern matching operation" may be performed. In some embodiments, the result may be generated by the comparator circuit, such as comparator 204.

At block 410, "storing the first result in a second register" may be performed. In some embodiments, the result may be stored in result register 206. In some embodiments, the result includes a count value of a number of times the first pattern is present in the data, a memory address of a location of a match of the first pattern in the data, a flag, wherein the flag has a first value if the first pattern is present in the data and a second value if the first pattern is not present in the data, and/or a combination thereof.

In some embodiments, method 400 may further include block 412 where "receiving a register write command" may be performed. In some embodiments, storing the first pattern in the first register may be performed responsive to the register write command. In some embodiments, the command may be received from a command decoder, such as command decoder 106.

In some embodiments, method 400 may further include block 414 where "receiving a pattern matching command" is performed. In some embodiments, performing the first pattern matching operation may be performed responsive to the pattern matching command. In some embodiments, the command may be received from a command decoder, such as command decoder 106. In some embodiments, the pattern matching command may be received before blocks 412, 402, 404, and/or 406 are performed. In some embodiments, the pattern matching command may be received after blocks 412, 402, and/or 404 are performed.

In some embodiments, method 400 may further include blocks 416 and 418 where "receiving a register read command" and "providing the first result from the second register responsive to the register read command" are performed. In some embodiments, the result may be output to an IO circuit such as IO circuit 122. In some embodiments, the result may be output to an alert pin.

In some embodiments, method 400 may further include block 420 where "writing a first value to a mode register" may be performed. In some embodiments, the first value may be written to mode register 132. In some embodiments, the first value may cause the mode register to enable the comparator circuit and/or pattern matching circuitry, such as pattern matching circuitry 130. In some embodiments, method 400 may further include block 422 where "programming a type of pattern matching operation" may be performed. In some embodiments, the pattern matching operation may be programmed to the comparator circuit. Block 422 may be performed before, after, or simultaneously with blocks 414 and/or 412.

In some embodiments, method 400 may further include block 424 where "providing an active alert signal" may be performed. In some embodiments, the active alert signal is responsive to storing the first result in the second register. In some embodiments, the active alert signal is provided by the comparator circuit. In some embodiments, the active alert signal is provided by the second register. In some embodiments, block 424 may be performed before, after and/or simultaneously with blocks 410, 416, and/or 418.

In some embodiments, method 400 may further include "storing a second pattern in the first register or a third register," "performing, with the comparator circuit, the pattern matching operation on the second pattern and the data to determine if the second pattern is present in the data," "generating a second result based on the pattern matching operation," and "storing the second result in the second register." In some embodiments, the third register may be included in pattern register 202. In some embodiments, performing the pattern matching operation on the second pattern is performed after performing the pattern matching operation on the first pattern and the data shown in blocks 402-410.

Figure 5:
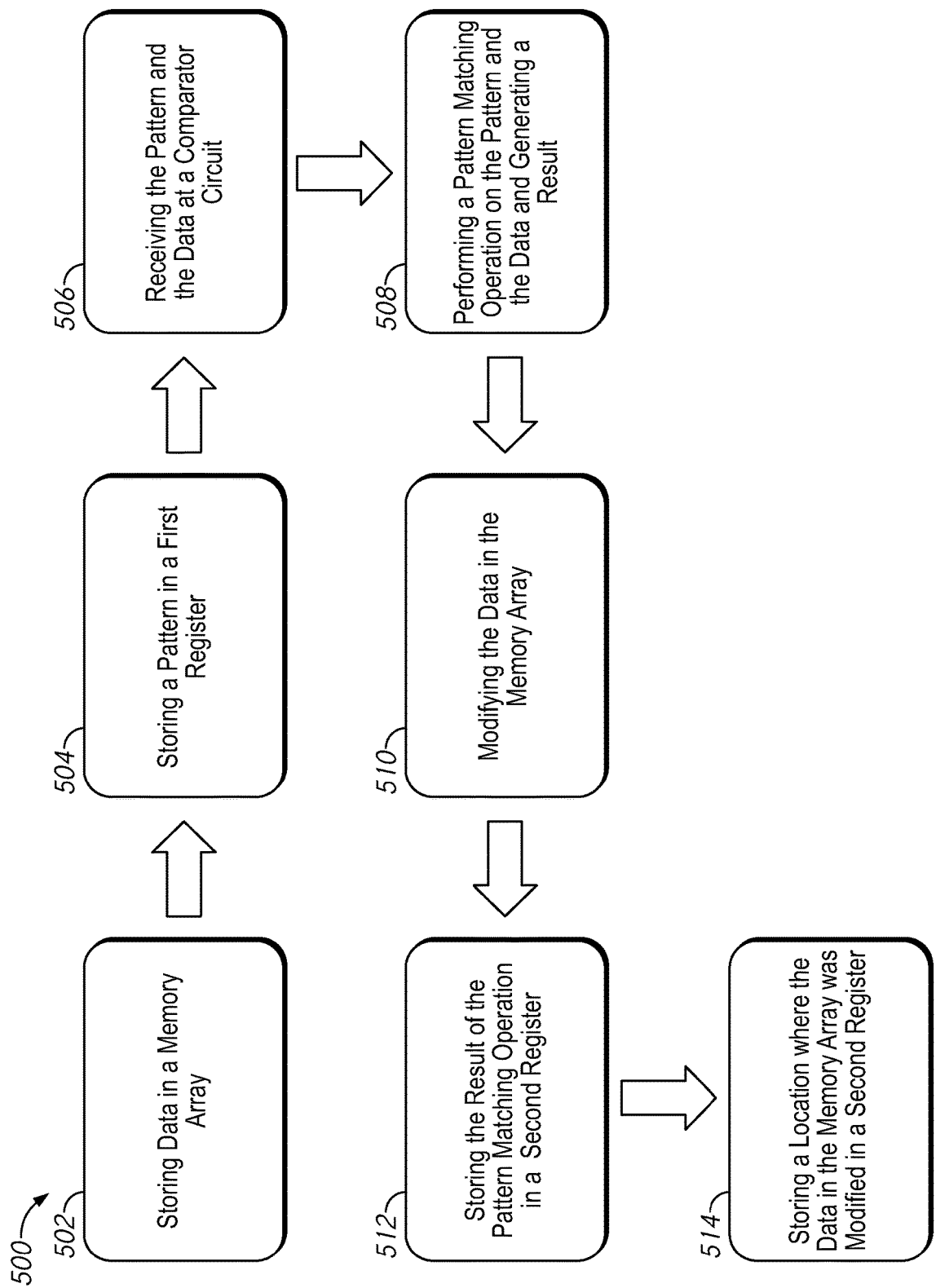
FIG. 5 is a flow chart of a method according to embodiments of the present disclosure.

FIG. 5 is a flow chart of a method 500 according to embodiments of the present disclosure. In some embodiments, the method 500 may be performed, at least in part, by device 100, pattern matching circuitry 200 and/or system 300.

At block 502, "storing data in a memory array" may be performed. The storing may be performed by one or more components of device 100 and/or memory 322 in some embodiments. At block 504, "storing a pattern in a first register" may be performed. The storing may be performed by pattern matching circuitry, such as pattern matching circuitry 130, pattern matching circuitry 200, and/or memory 322. At block 506, "receiving the pattern and the data at a comparator circuit," may be performed. In some embodiments, the comparator circuit may be comparator circuit 204. At block 508, "performing a pattern matching operation on the pattern and the data and generating a result" may be performed. In some embodiments, the pattern matching operation may be performed by the comparator circuit. In some embodiments, the pattern matching operation may determine if the pattern is present in the data.

At block 510, "modifying the data in the memory array" may be performed. In some embodiments, the modifying may be based on the result of the pattern matching operation. In some embodiments, the modifying the data in the memory array may be performed, at least in part, by pattern matching circuitry 130, pattern matching circuitry 200, and/or memory 322. In some embodiments, modifying the data may include deleting contents of the memory array at a location of the memory array where the data matches the pattern. In some embodiments, modifying the data may include writing a pre-determined value to the memory array at a location of the memory array where the data matches the pattern.

In some embodiments, method 500 may include block 512 where "storing the result of the pattern matching operation in a second register" may be performed. Block 512 may be performed before, after, or simultaneously with block 510 in some embodiments. In some embodiments, method 500 may include block 514 where "storing a location where the data in the memory array was modified in a second register" may be performed. Block 514 may be performed before, after, or simultaneously with block 510 and/or block 512 in some embodiments. In some embodiments, block 514 may be performed instead of block 512.

The apparatuses, systems, and methods described herein may allow pattern matching to be performed by a memory. This may allow data to be analyzed without being provided outside the memory to other processing circuitry. In some embodiments, only the results of the pattern matching operations may be provided by the memory. In some applications, this may reduce the time utilized for pattern matching operations. For example, rather than sending a variety of data from a memory array to a processor (e.g., a CPU) which may compare the data with a particular pattern, a memory device may be provided with a pattern matching capability. The processor may then request a pattern matching mode of operation and receive, from the memory device, information relating to the presence or absence of a particular pattern in a memory array.

Of course, it is to be appreciated that any one of the examples, embodiments or processes described herein may be combined with one or more other examples, embodiments and/or processes or be separated and/or performed amongst separate devices or device portions in accordance with the present systems, devices and methods.

Finally, the above-discussion is intended to be merely illustrative and should not be construed as limiting the appended claims to any particular embodiment or group of embodiments. Thus, while various embodiments of the disclosure have been described in particular detail, it should also be appreciated that numerous modifications and alternative embodiments may be devised by those having ordinary skill in the art without departing from the broader and intended spirit and scope of the present disclosure as set forth in the claims that follow. Accordingly, the specification and drawings are to be regarded in an illustrative manner and are not intended to limit the scope of the appended claims.

What is claimed is:

1. A method comprising:
   storing data in a memory array of a memory;
   storing a pattern in a first register of the memory;
   receiving the pattern and the data at a comparator circuit of the memory;
   receiving an active enable signal;
   responsive to the active enable signal, performing, with the comparator circuit, a pattern matching operation on the pattern and the data to determine if the pattern is present in the data and generating a result; and
   modifying the data in the memory array based on the result of the pattern matching operation.

2. A method comprising:
   storing data in a memory array of a memory;
   storing a pattern in a first register of the memory;
   receiving the pattern and the data at a comparator circuit of the memory;
   performing, with the comparator circuit, a pattern matching operation on the pattern and the data to determine if the pattern is present in the data and generating a result; and
   modifying the data in the memory array based on the result of the pattern matching operation, wherein modifying the data includes deleting contents of the memory array at a location of the memory array where the data matches the pattern.

3. A method comprising:
   storing data in a memory array of a memory;
   storing a pattern in a first register of the memory;
   receiving the pattern and the data at a comparator circuit of the memory;
   performing, with the comparator circuit, a pattern matching operation on the pattern and the data to determine if the pattern is present in the data and generating a result; and
   modifying the data in the memory array based on the result of the pattern matching operation, wherein modifying the data includes writing a pre-determined value to the memory array at a location of the memory array where the data matches the pattern.

4. A method comprising:
   storing data in a memory array of a memory;
   storing a pattern in a first register of the memory;
   receiving the pattern and the data at a comparator circuit of the memory;
   performing, with the comparator circuit, a pattern matching operation on the pattern and the data to determine if the pattern is present in the data and generating a result;
   modifying the data in the memory array based on the result of the pattern matching operation; and
   storing the result of the pattern matching operation in a second register of the memory.

5. A method comprising:
storing data in a memory array of a memory;
storing a pattern in a first register of the memory;
receiving the pattern and the data at a comparator circuit of the memory;
performing, with the comparator circuit, a pattern matching operation on the pattern and the data to determine if the pattern is present in the data and generating a result;
modifying the data in the memory array based on the result of the pattern matching operation; and
storing a location where the data in the memory array was modified in a second register of the memory.

6. A method comprising:
storing data in a memory array of a memory;
storing a pattern in a first register of the memory;
receiving the pattern and the data at a comparator circuit of the memory;
performing, with the comparator circuit, a pattern matching operation on the pattern and the data to determine if the pattern is present in the data and generating a result;
modifying the data in the memory array based on the result of the pattern matching operation; and
providing a signal based on a result of the pattern matching operation, wherein the signal has a first state if the pattern is included in the data and a second state if the pattern is not included in the data.

7. A method comprising:
storing data in a memory array of a memory;
storing a pattern in a first register of the memory;
receiving the pattern and the data at a comparator circuit of the memory;
performing, with the comparator circuit, a pattern matching operation on the pattern and the data to determine if the pattern is present in the data and generating a result; and
modifying the data in the memory array based on the result of the pattern matching operation, wherein performing the pattern matching operation comprises finding an exact match of the pattern, finding matches within a certain percentage of the pattern, or a combination thereof.

8. A method comprising:
storing data in a memory array of a memory;
storing a pattern in a first register of the memory;
receiving the pattern and the data at a comparator circuit of the memory;
performing, with the comparator circuit, a pattern matching operation on the pattern and the data to determine if the pattern is present in the data and generating a result; and
modifying the data in the memory array based on the result of the pattern matching operation, method of claim 1, wherein the pattern is a vector and performing the pattern matching operation comprises finding vectors in the data within a certain distance of the vector.

9. A memory comprising:
a comparator circuit, responsive to a pattern matching command, configured to:
perform a pattern matching operation to determine if data provided to the comparator circuit includes a pattern provided to the comparator circuit; and
provide a signal based on a result of the pattern matching operation, wherein the signal has a first state if the pattern is included in the data and a second state if the pattern is not included in the data, wherein the signal is provided to an external terminal of the memory; and
a made register configured to provide an enable signal, wherein the comparator responsive to the pattern matching command when the enable signal is in a first state and the comparator ignores the pattern matching command when the enable signal is in a second state.

10. The memory of claim 9, further comprising a first register, wherein the enable signal enables the pattern to be written to the first register.

11. The memory of claim 9, further comprising a data output terminal accessible to a device outside the memory, wherein the comparator circuit is further configured to provide the result to the data output terminal.

12. The memory of claim 11, wherein the result includes at least one of a count value of a number of times the pattern is present in the data or a memory address of a location of a match of the pattern in the data.

13. The memory of claim 9, further comprising an alert pin accessible to a device outside the memory, wherein the signal is provided to the alert pin.

14. The memory of claim 9, wherein a state of the enable signal is based on a value written to the mode register.

15. The memory of claim 14, wherein the value is written to the mode register responsive to a mode register write command provided by a memory controller in communication with the memory.

16. A memory comprising:
a memory array;
a first register configured to store a pattern;
a comparator circuit configured, when enabled, to perform a pattern matching operation on the pattern and the data to determine if the pattern is present in the data and generate a result, wherein the memory is configured to modify the data in the memory array based on the result of the pattern matching operation; and
a mode register configured to provide an enable signal to the comparator circuit to enable and disable the comparator circuit.

17. A memory comprising:
a memory array;
a first register configured to store a pattern;
a comparator circuit configured to perform a pattern matching operation on the pattern and the data to determine if the pattern is present in the data and generate a result,
wherein the memory is configured to modify the data in the memory array based on the result of the pattern matching operation; and
a second register configured to store the result of the pattern matching operation.

18. A memory comprising:
a memory array;
a first register configured to store a pattern;
a comparator circuit configured to perform a pattern matching operation on the pattern and the data to determine if the pattern is present in the data and generate a result, wherein the memory is configured to modify the data in the memory array based on the result of the pattern matching operation; and
a second register configured to store a location where the data in the memory array was modified.

19. A memory comprising:
a memory array;
a first register configured to store a pattern; and a comparator circuit configured to perform a pattern matching operation on the pattern and the data to determine if the pattern is present in the data and generate a result, wherein the memory is configured to modify the data in the memory array based on the result of the pattern matching operation, and wherein the memory is configured to delete contents of the memory allay at a location of the memory array where the data matches the pattern.

20. A memory comprising:
a memory array;
a first register configured to store a pattern; and
a comparator circuit configured to perform a pattern matching operation on the pattern and the data to determine if the pattern is present in the data and generate a result, wherein the memory is configured to modify the data in the memory array based on the result of the pattern matching operation, and wherein the memory is configured to write a pre-determined value to the memory array at a location of the memory array where the data matches the pattern.

* * * * *

UNITED STATES PATENT AND TRADEMARK OFFICE
CERTIFICATE OF CORRECTION

PATENT NO. : 11,829,366 B2
APPLICATION NO. : 17/819793
DATED : November 28, 2023
INVENTOR(S) : Debra M. Bell et al.

Page 1 of 1

It is certified that error appears in the above-identified patent and that said Letters Patent is hereby corrected as shown below:

In the Claims

| Column | Line | Claim | Reads | Should Read |
|---|---|---|---|---|
| 13 | 55 | 8 | the pattern rnatching operation, method of claim 1, wherein the pattern | the pattern matching operation, wherein the pattern |
| 14 | 4 | 9 | a made register configured to provide | a mode register configured to provide |
| 14 | 5 | 9 | wherein the comparator responsive to the pattern matching command | wherein the comparator is responsive to the pattern matching command |
| 15 | 8 | 9 | the memory allay | the memory array |

Signed and Sealed this
Thirtieth Day of January, 2024

Katherine Kelly Vidal
*Director of the United States Patent and Trademark Office*